(12) United States Patent
Bidal

(10) Patent No.: US 9,530,686 B1
(45) Date of Patent: Dec. 27, 2016

(54) MOS TRANSISTOR AND METHOD OF MANUFACTURING THE SAME

(71) Applicant: STMicroelectronics (Crolles 2) SAS, Crolles (FR)

(72) Inventor: Gregory Bidal, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/043,830

(22) Filed: Feb. 15, 2016

(30) Foreign Application Priority Data

Aug. 24, 2015 (FR) ...................... 15 57878

(51) Int. Cl.
| | |
|---|---|
| *H01L 21/336* | (2006.01) |
| *H01L 21/762* | (2006.01) |
| *H01L 21/28* | (2006.01) |
| *H01L 29/06* | (2006.01) |
| *H01L 29/423* | (2006.01) |
| *H01L 29/78* | (2006.01) |
| *H01L 29/66* | (2006.01) |

(52) U.S. Cl.
CPC ..... *H01L 21/7624* (2013.01); *H01L 21/28026* (2013.01); *H01L 21/28158* (2013.01); *H01L 29/0649* (2013.01); *H01L 29/42364* (2013.01); *H01L 29/66477* (2013.01); *H01L 29/78* (2013.01)

(58) Field of Classification Search
CPC .............. H01L 29/66545; H01L 29/78; H01L 29/0653; H01L 29/42376; H01L 21/02532; H01L 21/76224; H01L 29/42372; H01L 29/0642

USPC .......................................... 438/299; 257/346
See application file for complete search history.

(56) References Cited

U.S. PATENT DOCUMENTS

| | | | |
|---|---|---|---|
| 6,479,866 B1* | 11/2002 | Xiang ............... | H01L 21/76264 257/192 |
| 2007/0134859 A1 | 6/2007 | Curello et al. | |
| 2007/0246752 A1 | 10/2007 | Cheng et al. | |
| 2008/0169490 A1 | 7/2008 | Kawai | |
| 2011/0024840 A1 | 2/2011 | Khater | |
| 2011/0204384 A1* | 8/2011 | Cheng ................. | H01L 29/1079 257/77 |
| 2015/0228735 A1 | 8/2015 | Zhong et al. | |

FOREIGN PATENT DOCUMENTS

EP 2765613 A1 8/2014

OTHER PUBLICATIONS

INPI Search Report and Written Opinion for FR 1557878 dated Jun. 9, 2016 (8 pages).

\* cited by examiner

*Primary Examiner* — Theresa T Doan
(74) *Attorney, Agent, or Firm* — Gardere Wynne Sewell, LLP

(57) ABSTRACT

A MOS transistor includes a semiconductor layer resting on an insulator and having a substantially planar upper surface. The semiconductor layer extends down to a first depth in the channel region, and down to a second depth, greater than the first depth, in the source and drain regions. In the channel region, the semiconductor layer is formed from a portion of an upper semiconductor layer of a silicon on insulator substrate. In the source and drain regions, the semiconductor layer is formed by epitaxially grown semiconductor material.

15 Claims, 4 Drawing Sheets

MOS TRANSISTOR AND METHOD OF MANUFACTURING THE SAME

PRIORITY CLAIM

This application claims the priority benefit of French Application for Patent No. 1557878, filed on Aug. 24, 2015, the contents of which is hereby incorporated by reference in its entirety to the maximum extent allowable by law.

TECHNICAL FIELD

The present disclosure relates to a MOS transistor and to a method of manufacturing the same.

BACKGROUND

MOS transistors formed from a structure comprising a semiconductor layer resting on an insulating layer, itself resting on a substrate, that is, an SOI-type structure ("Semiconductor On Insulator") are known.

FIG. 1 shows a first example of a MOS transistor formed from an SOI-type structure.

MOS transistor 1 of FIG. 1 comprises, between source and drain regions 3, a channel region 5 arranged under a gate stack 7 laterally bordered with spacers 9. Regions 3 and 5 are formed in a semiconductor layer 11. Semiconductor layer 11 rests on an insulating layer 13, itself resting on a semiconductor substrate 15, layers 11 and 13 forming an SOI-type structure. The transistor is laterally delimited and insulated by insulating walls 17 crossing semiconductor layer 11 and insulating layer 13.

In such a transistor, the thickness of semiconductor layer 11 is very small, from a few nanometers to a few tens of nanometers, which enables, in operation, to obtain a fully depleted channel region 5. However, this causes various disadvantages, particularly for the resistance of access to the source and to the drain, which increases when the thickness of layer 11 decreases.

FIG. 2 shows a second example of a MOS transistor.

MOS transistor 21 of FIG. 2, similar to MOS transistor 1, further comprises, on regions 3, epitaxial semiconductor regions 23 which contribute to increasing the thickness of the source and drain regions. Each region 23 laterally borders the corresponding gate spacer 9 along part of its height.

A disadvantage of such a transistor is that the stray capacitance between the gate stack and the source and drain regions increases.

Such MOS transistors and their manufacturing methods have various disadvantages, and the present disclosure aims at overcoming at least some of these.

SUMMARY

Thus, an embodiment provides a MOS transistor comprising a semiconductor layer resting on an insulator and having a substantially planar upper surface, the semiconductor layer extending down to a first depth in the channel region, and down to a second depth greater than the first depth in the source and drain regions.

A method of manufacturing a MOS transistor is also provided, comprising the steps of: a) providing a semiconductor substrate coated with a first insulating layer and with a first semiconductor layer; b) forming insulating walls penetrating into the substrate and laterally delimiting the location of the transistor, and forming, on the first semiconductor layer, a gate stack coated with a second insulating layer; c) etching, between the insulating walls and on either side of the gate stack, the first semiconductor layer and the first insulating layer all the way to the substrate; d) growing by epitaxy a sacrificial semiconductor layer from the substrate to an intermediate level of the first insulating layer; e) growing a second semiconductor layer by epitaxy from the sacrificial layer to the upper level of the first semiconductor layer; f) etching an upper portion of the walls to laterally expose the sacrificial layer; g) forming cavities between the substrate and the second semiconductor layer by removing the sacrificial layer; and h) filling said cavities with at least one insulator.

According to an embodiment, the substrate and the second semiconductor layer are made of silicon, and the sacrificial layer is made of silicon-germanium.

According to an embodiment, the method further comprises, between steps f) and g), a step of forming a third insulating layer on the walls of the cavities, on the gate stack, and on the exposed surfaces of the second semiconductor layer; and a step of removing the portions of the third insulating layer resting on the upper surface of the second semiconductor layer and on the top of the gate stack.

According to an embodiment, the third insulating layer is made of silicon oxide.

According to an embodiment, step h) comprises depositing a fourth insulating layer on the gate stack, the second semiconductor layer, and in the cavities, and then removing the portions of the fourth insulating layer resting on the top of the gate stack and on the upper surface of the second semiconductor layer to form spacers on either side of the gate stack.

According to an embodiment, the fourth insulating layer is made of silicon nitride.

According to an embodiment, after step h), a portion of the second insulating layer resting on the top of the gate stack is removed by etching to form spacers on either side of the gate stack.

According to an embodiment, the second insulating layer is made of silicon nitride.

According to an embodiment, the thickness of the second semiconductor layer ranges from 8 to 75 nm.

According to an embodiment, the thickness of the first semiconductor layer ranges from 3 to 30 nm.

BRIEF DESCRIPTION OF THE DRAWINGS

The foregoing and other features and advantages will be discussed in detail in the following non-limiting description of specific embodiments in connection with the accompanying drawings.

DETAILED DESCRIPTION

Figure 1:
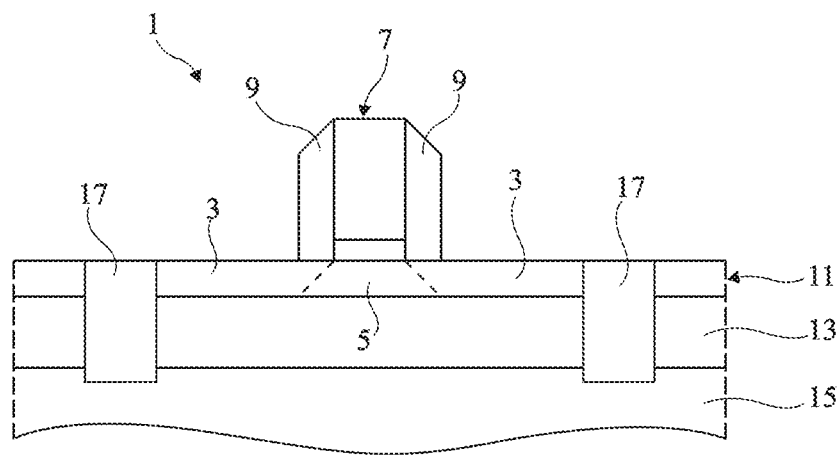
FIGS. 1 and 2, previously described, are simplified cross-section views, each showing an example of a MOS transistor formed from an SOI-type structure.

The same elements have been designated with the same reference numerals in the different drawings and, further, the various drawings are not to scale. For clarity, only those elements which are useful to the understanding of the described embodiments have been shown and are detailed. In the following description, terms such as "on", "upper", "lower" refer to the orientation of the concerned elements in the corresponding drawings. Unless otherwise specified, term "substantially" means to within 10%, preferably to within 5%, when it concerns thickness values, and to within 5 nm, preferably to within 1 nm, when it concerns a level. Further, unless otherwise specified, a first element "resting on" a second element means that the first and second elements are in contact with each other.

Figure 2:
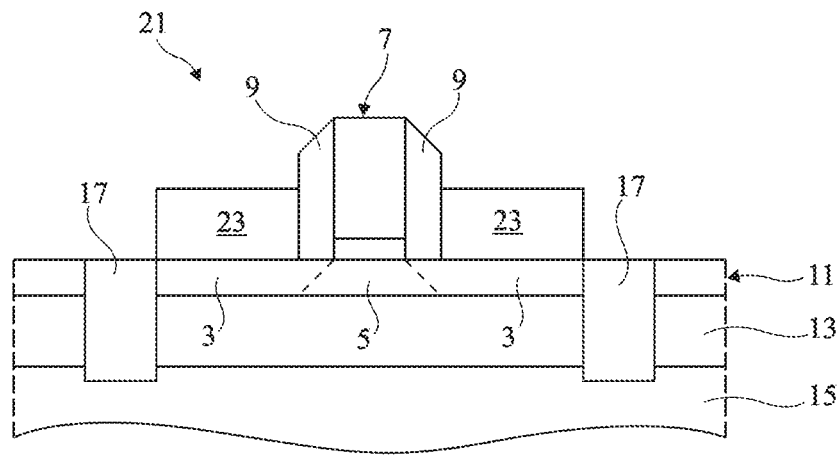
Figure 3:
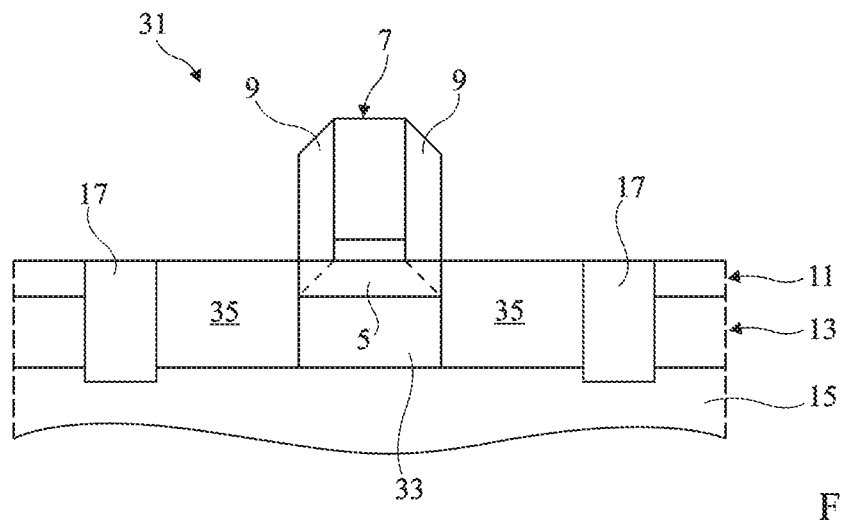
FIG. 3 is a simplified cross-section view of an example of a transistor formed from a SOI-type structure.

FIG. 3 shows an example of MOS transistor enabling to avoid at least some of the disadvantages of the transistors of FIGS. 1 and 2.

In transistor 31 of FIG. 3, semiconductor layer 11 and insulating layer 13 have been etched all the way to substrate 15, between insulating walls 17, by using gate stack 7 and spacers 9 as an etch mask. As a result, channel region 5 rests on an insulating region 33 corresponding to a portion of insulating layer 13. Deep source and drain regions 35 have then been formed by epitaxy from substrate 15 all the way to the upper level of semiconductor layer 11.

A disadvantage of such a transistor is that the deep source and drain regions are not insulated from substrate 15.

It would thus be desirable to have a transistor having the advantages of transistors 1, 21, and 31 without their disadvantages.

Figure 4:
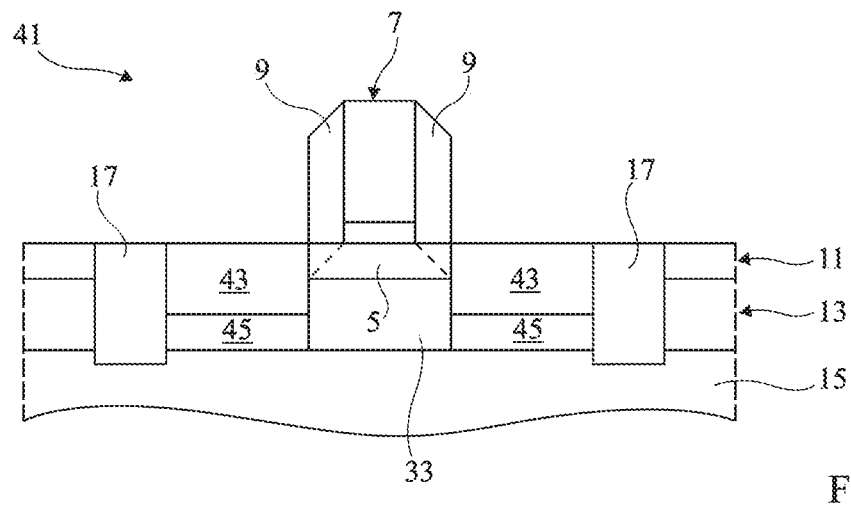
FIG. 4 is a simplified cross-section view of an embodiment of a MOS transistor formed from a SOI-type structure.

FIG. 4 is a cross-section view schematically showing an embodiment of a MOS transistor.

MOS transistor 41 of FIG. 4 is similar to transistor 31 of FIG. 3 with the difference that the deep source and drain regions of transistor 43 are insulated from the substrate. More specifically, in transistor 41, deep source and drain regions 43 rest on at least one insulating layer 45 arranged on substrate 15. Each of regions 43 extends upwards from an intermediate level of insulating region 33 all the way to the upper level of channel region 5. Thus, the source, drain, and channel regions of the transistor are formed in a semiconductor layer having a substantially planar upper surface, this semiconductor layer being thicker at the level of the source and drain regions than at the level of the channel region.

In such a transistor, the small thickness of the channel region enables, in operation, to obtain a fully depleted channel region. Further, the transistor has a low source and drain access resistance due to the fact that the deep source and drain regions are thick, as well as a low stray capacitance between the gate stack and the source and drain regions due to the fact that the deep source and drain regions do not border the gate spacers.

FIGS. 5A to 5H are simplified cross-section views illustrating a structure at successive steps of an embodiment of a method of manufacturing a transistor of the type in FIG. 4.

Figure 5A:
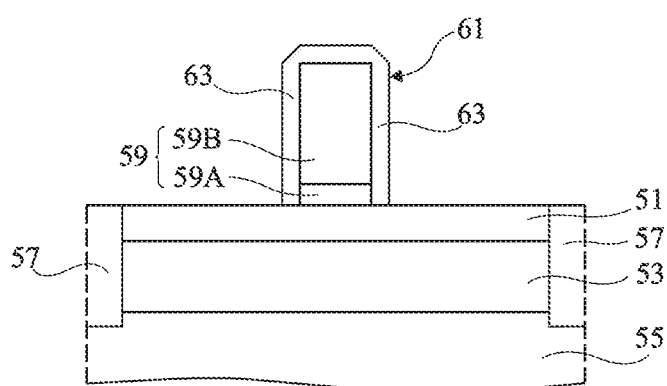
FIGS. 5A to 5H are simplified cross-section views of a structure at successive steps of an embodiment of a method of manufacturing a transistor of the type in FIG. 4.

In FIG. 5A, the structure comprises a semiconductor layer 51, doped with a first conductivity type, resting on an insulating layer 53, itself resting on a semiconductor substrate 55, layers 51 and 53 forming an SOI-type structure. Insulating walls 57 have been formed through layers 51 and 53 and penetrate into substrate 55. Insulating walls 57 laterally delimit the location of the transistor to be formed. A gate stack 59 comprising a gate insulator 59A topped with a gate electrode 59B has been formed on semiconductor layer 51. An insulating layer 61 coats gate stack 59 and forms spacers 63 on the sides thereof.

As an example, semiconductor layer 51 is a silicon layer. The thickness of semiconductor layer 51 may be in the range from 3 to 30 nm. Insulating layer 53 for example is silicon oxide. The thickness of layer 53 is for example in the range from 10 to 30 nm. Substrate 55 is for example made of single-crystal silicon. Insulating walls 57 are for example made of silicon oxide. The material of layer 61, for example, silicon nitride, is selected so that layers 51 and 53 are selectively etchable over layer 61.

Figure 5B:
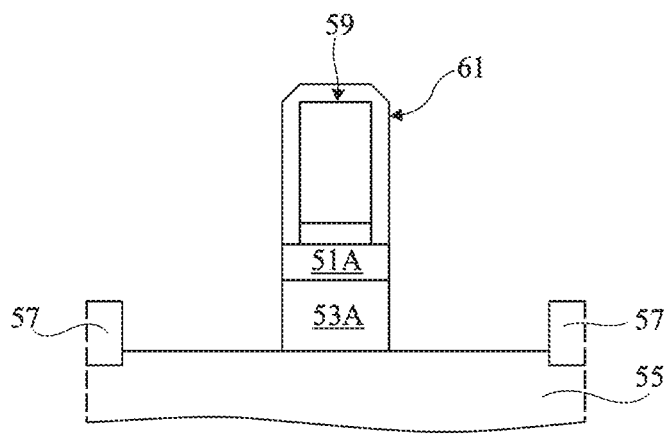

FIG. 5B shows the structure of FIG. 5A after the removal by etching, all the way to substrate 55, of semiconductor layer 51 and of insulating layer 53, gate stack 59 coated with insulating layer 61 being used as an etch mask. Thus, under gate stack 59 coated with layer 61, there remains a portion 51A of semiconductor layer 51 and a portion, or region, 53A of insulating layer 53, semiconductor portion 51A resting on insulating region 53A and corresponding to the channel region of the transistor.

As shown herein, when insulating walls 57 are made of the same material as insulating layer 53, an upper portion of the walls is also removed during the etching of layer 53.

Figure 5C:
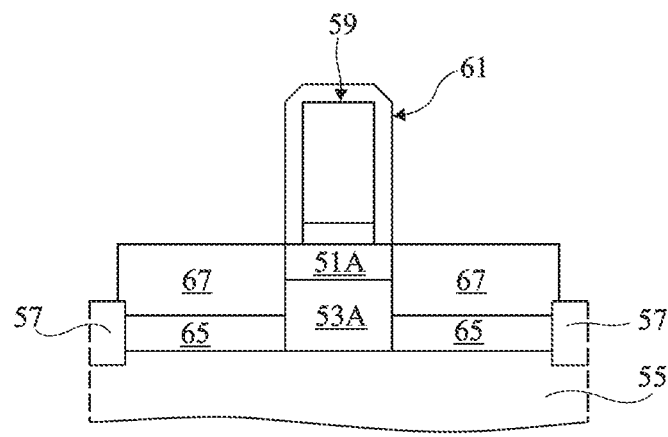

FIG. 5C shows the structure of FIG. 5B after the forming of a sacrificial semiconductor layer 65 by epitaxy from substrate 55 all the way to an intermediate level (i.e., between its upper and lower surfaces) of insulating region 53A. Further, a semiconductor layer 67 has been formed by epitaxy from sacrificial layer 65 all the way to a level substantially identical to the level of the upper surface of channel region 51A.

The material of sacrificial layer 65, for example, SiGe, is selected to be able to grow in single-crystal form on single-crystal substrate 55 and so that semiconductor layer 67 can grow in single-crystal form on layer 65. Further, the material of sacrificial layer 65 is selected to be selectively etchable over that of layer 67 and of substrate 55. The thickness of sacrificial layer 65 is for example in the range from one quarter of to half that of insulating region 53A. The material of semiconductor layer 67 may be the same as that of channel region 51A, in this example, silicon. Semiconductor layer 67 may be doped, on forming thereof by epitaxy, with the conductivity type opposite to that of channel region 51A. The thickness of layer 67 is for example in the range from 8 to 75 nm.

Figure 5D:
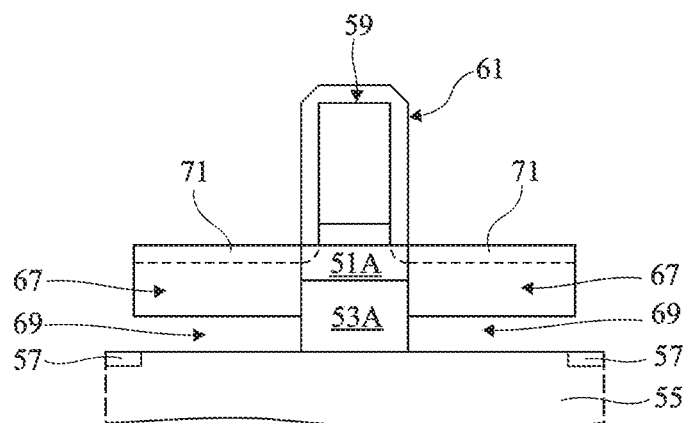

FIG. 5D shows the structure of FIG. 5C after the removal by etching of an upper portion of insulating walls 57 to laterally expose sacrificial layer 65. The sacrificial layer is then removed by selective etching over substrate 55, over semiconductor layer 67, and over insulating layer 53A to form, on either side of insulating region 53A, cavities 69 extending between substrate 55 and layer 67. As shown herein, doped regions 71 of the second conductivity type may be formed by implantation into layer 67. Regions 71 partly diffuse in region 51A, under gate spacers 63, to form source and drain, or LDD ("Lightly Doped Drain") extensions.

Figure 5E:
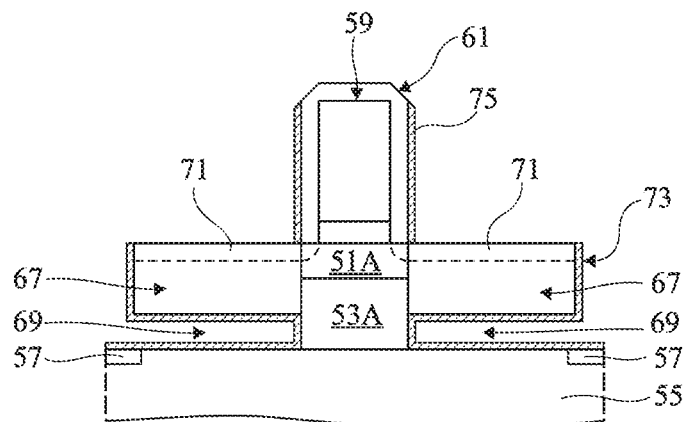

FIG. 5E shows the structure of FIG. 5D after the forming of an insulating layer 73 over the entire exposed surface of the structure, layer 73 being removed from the upper surface of semiconductor layer 67. The portions of layer 73 remaining on the sides of gate stack 59 bordered with spacers 63 are designated with reference numeral 75.

As an example, layer 73 is a silicon oxide layer. The thickness of layer 73 is for example in the range from 1 to 20 nm. Layer 73 is for example formed by chemical vapor deposition.

Figure 5F:
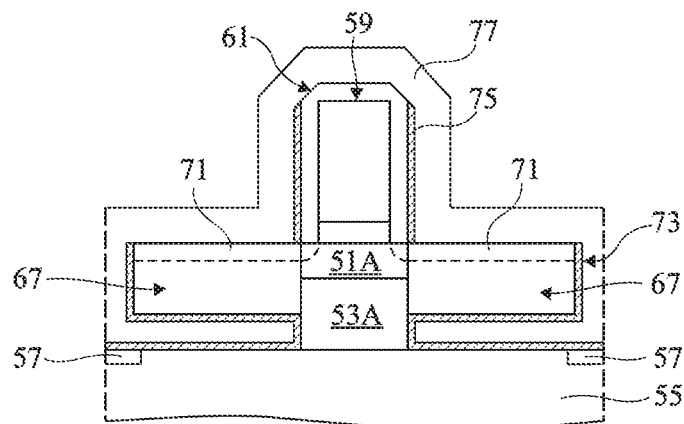

FIG. 5F shows the structure of FIG. 5E after the deposition of an insulating layer 77, over the entire exposed surface of the structure. The deposition is performed so as, in particular, to fill cavities 69. Thus, semiconductor layer 67 is insulated from substrate 55 by the materials of layers 73 and 77, layers 73 and 77 also enabling to laterally insulate layer 67.

As an example, insulating layer 77 is made of silicon nitride and may be formed by chemical vapor deposition or by the so-called ALD or "Atomic Layer Deposition" technique.

Figure 5G:
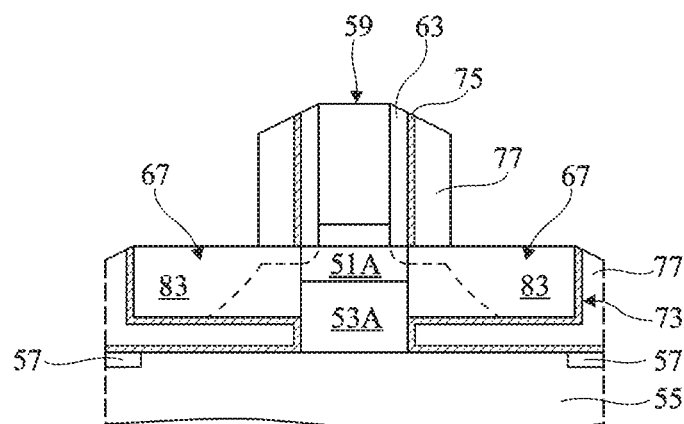

FIG. 5G shows the structure of FIG. 5F after the removal by etching of portions of layer 77 resting on the upper surface of layer 67, of a portion of layer 77 resting on layer 61, and of a portion of layer 61 resting on the top of gate stack 59. Thus, gate stack 59 is bordered by a spacer resulting from the assembly of layers, or layer portions, 63, 75 and 77. A step of doping layer 67 is then carried out to form therein doped source and drain regions 83 of the second conductivity type.

A transistor of the same type as transistor 41 of FIG. 4 is thus obtained.

Figure 5H:
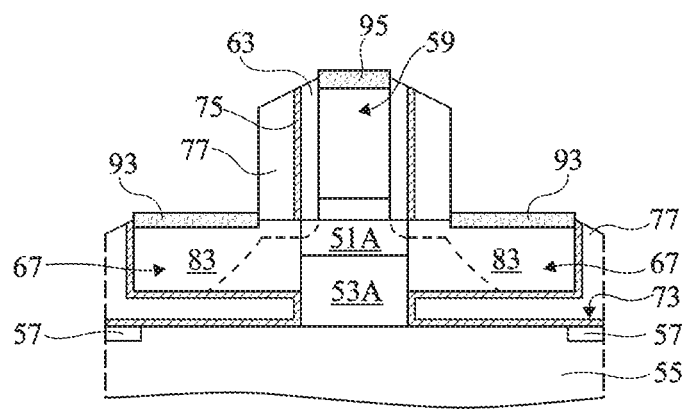

FIG. 5H shows the structure of FIG. 5G after siliciding of the exposed surface of source and drain regions 83, and possibly of the exposed surface of gate 59, to form silicided regions 93 at the level of the exposed surface of source and drain regions 83 and possibly a silicided region 95 at the top of gate stack 59.

Since the sides of gate stack 59 are successively bordered with spacers 63, 75, and 77, silicided regions 93 do not penetrate into channel region 51A.

Specific embodiments have been described. Various alterations, modifications, and improvements will occur to those skilled in the art. In particular, the order and the number of the steps of the previously-described manufacturing method may be modified. For example, it is possible not to carry out the deposition of layer 73, the forming of spacers 75, and/or the forming of doped regions 71 in layer 67.

Similarly, the gate stack has not been described in detail. Different types of stacks may be used: insulators of high permittivity may be provided as a gate insulator, and the gate electrode and conductive gate stack may comprise metal layers.

Further, the materials and the thicknesses of the previously-described layers may be adapted by those skilled in the art.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of manufacturing a MOS transistor, comprising the steps of:
   a) forming insulating walls penetrating into a semiconductor substrate coated with a first insulating layer and with a first semiconductor layer, said insulating walls laterally delimiting a location of the MOS transistor;
   b) forming a gate stack coated with a second insulating layer on the first semiconductor layer;
   c) etching, between the insulating walls and on each side of the gate stack, the first semiconductor layer and the first insulating layer all the way to the semiconductor substrate to form openings;
   d) epitaxially growing in said openings a sacrificial semiconductor layer from the semiconductor substrate to an intermediate level of the first insulating layer;
   e) epitaxially growing a second semiconductor layer from the sacrificial semiconductor layer to an upper level of the first semiconductor layer;
   f) etching the insulating walls to laterally expose the sacrificial semiconductor layer;
   g) removing the sacrificial semiconductor layer to form cavities between the semiconductor substrate and the second semiconductor layer; and
   h) filling said cavities with at least one insulator.

2. The method of claim 1, wherein the semiconductor substrate and the second semiconductor layer are made of silicon, and the sacrificial semiconductor layer is made of silicon-germanium.

3. The method of claim 1, further comprising, between steps f) and g):
   forming a third insulating layer on walls of the cavities, on the gate stack and on exposed surfaces of the second semiconductor layer; and
   removing the portions of the third insulating layer resting on the upper surface of the second semiconductor layer and on the top of the gate stack.

4. The method of claim 3, wherein the third insulating layer is made of silicon oxide.

5. The method of claim 1, wherein step h) comprises:
   depositing a fourth insulating layer on the gate stack, the second semiconductor layer and in the cavities, and
   then removing the portions of the fourth insulating layer resting on the top of the gate stack and on the upper surface of the second semiconductor layer to form spacers on either side of the gate stack.

6. The method of claim 5, wherein the fourth insulating layer is made of silicon nitride.

7. The method of claim 1, further comprising, after step h), removing a portion of the second insulating layer resting on the top of the gate stack by etching to form spacers on either side of the gate stack.

8. The method of claim 2, wherein the second insulating layer is made of silicon nitride.

9. The method of claim 1, wherein a thickness of the second semiconductor layer is between 8 nm and 75 nm.

10. The method of claim 1, wherein a thickness of the first semiconductor layer is between 3 nm and 30 nm.

11. A method, comprising:
   forming a gate stack on top of a silicon on insulator substrate having a semiconductor substrate coated with a first insulating layer and with a first semiconductor layer;
   using the gate stack as a mask to etch the silicon on insulator substrate to remove the first insulating layer and first semiconductor layer forming openings on each side of the gate stack;
   epitaxially growing a sacrificial semiconductor layer from the semiconductor substrate at a bottom of each opening;
   epitaxially growing a second semiconductor layer from the sacrificial semiconductor layer in each opening to form source and drain regions on opposite sides of a channel region formed by a portion of the first semiconductor layer under the gate stack;
   removing the sacrificial semiconductor layer to form cavities under the source and drain regions; and
   filling the cavities with an insulating material.

12. The method of claim 11, wherein filling comprises depositing an insulating liner that lines the bottom of the source and drain regions, a side of a portion of the first insulating layer under the gate stack and an upper surface of the semiconductor substrate.

13. The method of claim 12, wherein depositing the insulating liner further comprises depositing the insulating liner on sidewalls of the gate stack.

14. The method of claim 12, wherein filling further comprises depositing an insulating fill material in contact with the insulating liner.

15. The method of claim 12,
   wherein depositing the insulating liner further comprises depositing the insulating liner on sidewalls of the gate stack; and
   wherein depositing the insulating fill material further comprises depositing the insulating fill material on sidewalls of the gate stack.

\* \* \* \* \*